United States Patent [19]
Rusche et al.

[11] Patent Number: 6,028,865
[45] Date of Patent: Feb. 22, 2000

[54] CONNECTING DEVICE FOR AN ELECTRICAL INSTALLATION SYSTEM

[75] Inventors: Dieter Rusche; Holger Strack; Ulrich Tschirwitz, all of Bamberg; Dieter Woelfel, Forchheim; Michael Ziegmann, Bamberg, all of Germany

[73] Assignee: Wieland Electric GmbH, Bamberg, Germany

[21] Appl. No.: 08/800,429

[22] Filed: Feb. 18, 1997

[30] Foreign Application Priority Data

Feb. 16, 1996 [DE] Germany .............. 196 05 698

[51] Int. Cl.[7] ................................................ H04Q 1/00
[52] U.S. Cl. .................................... 370/419; 439/712
[58] Field of Search ..................... 370/419; 439/701, 439/712, 724, 928; 705/28; 240/825.52, 825.53, 310.08

[56] References Cited

U.S. PATENT DOCUMENTS

| | | | |
|---|---|---|---|
| 4,418,333 | 11/1983 | Schwarzbach | 340/310.08 |
| 4,703,306 | 10/1987 | Barritt | 340/310.08 |
| 4,730,251 | 3/1988 | Aakre | 705/28 |
| 5,051,720 | 9/1991 | Kittirutsunetorn | 340/310.08 |
| 5,530,435 | 6/1996 | Toms | 340/310.08 |

FOREIGN PATENT DOCUMENTS

| | | |
|---|---|---|
| 4019465 | 10/1991 | Germany . |
| 4200818 | 7/1993 | Germany . |

OTHER PUBLICATIONS

Wieland publication : WIB Wieland Installations Bus, Imprint 0054.

*Primary Examiner*—Brian Zimmerman
*Attorney, Agent, or Firm*—Jordan and Hamburg LLP

[57] ABSTRACT

A connecting device for an electrical installation system for controlling consuming devices and/or for redirecting status signals over a data line with serial digital data transfer on an external bus line. The control and status signal information are passed through a bus coupling unit in a base module to a microcontroller of the base module. The microcontroller of the base module passes information and controls function-specific expansion modules with digital and/or analog inputs and/or outputs for the respective consuming devices. The base module and the expansion modules are connected in an internally communicating manner with the base module, the connection including an internal data bus interconnecting the microcontroller of the base module with microcontrollers of the expansion modules. Additionally, connector device are provide for interconnecting line power from the base module to and through the expansion modules.

31 Claims, 5 Drawing Sheets

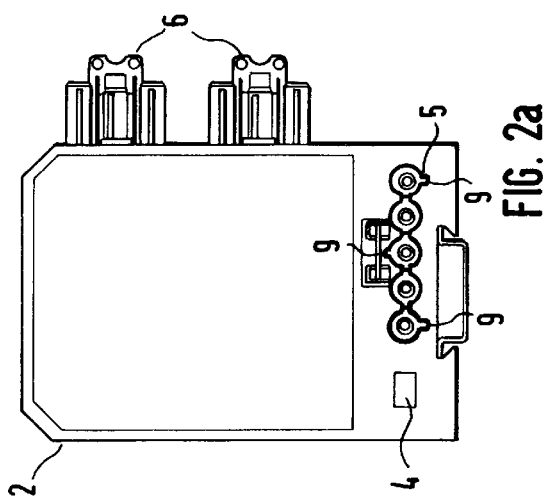
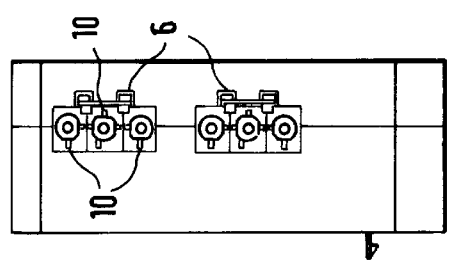
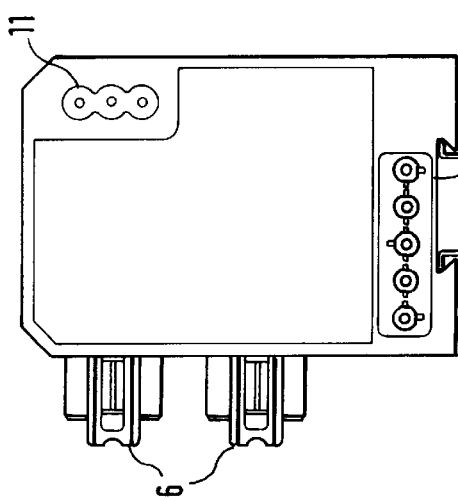
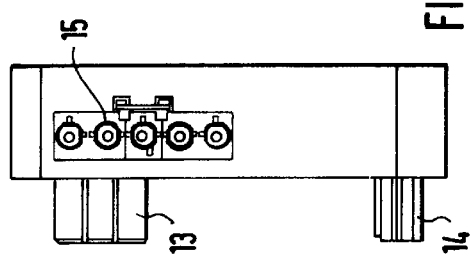
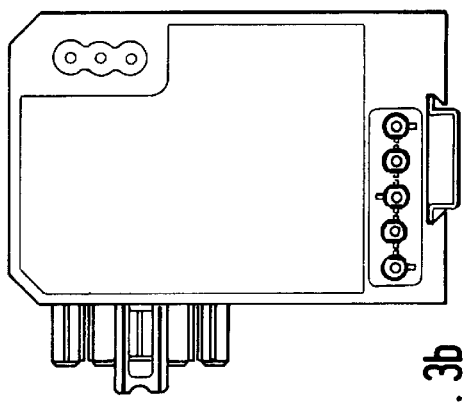

CONNECTING DEVICE FOR AN ELECTRICAL INSTALLATION SYSTEM

BACKGROUND OF THE INVENTION

The present invention relates to a connecting device for an electrical installation system for controlling consuming devices and/or for redirecting status signals over a data line from an external bus line using serial digital data transfer. The connecting device passes control and/or status information from the external bus line through a base module, having a bus coupling unit, to function-specific expansion modules with digital and/or analog inputs and/or outputs for the respective consuming devices. The expansion modules are interconnectable with the basic module in an internally communicating manner.

Systems which use a bus line within a building for transferring data and signals for controlling consuming devices are known. For this purpose, so-called "intelligent" consuming devices are used into each of which a dedicated bus coupling unit is integrated. If a signal is now supplied to the bus by means of a switch, which is also connected in the bus line over a dedicated bus coupling, each consuming device selects the signal specific for it by means of its own bus coupling unit, that is, each consumer-side bus coupling unit is addressed in a defined manner with the signal and, with that, the consuming device is operated. It is a disadvantage here that, as a result of the dedicated bus coupling unit, the consuming device becomes more expensive than normal consuming devices.

The DE 42 00 818 A1 and also the Wieland publication, WIB Wieland Installations Bus, Imprint 0054 . 1Mü 9.92, disclose a distributor, which is connected in a bus line and has dedicated bus coupling units which are followed by appropriate switching elements. In this system, the bus couplers analyze the signals supplied by the building bus and switch the switching device following them, such as a relay, appropriately. Consequently, the bus line is no longer directly connected to the consuming device so that the latter does not have to be equipped with the expensive bus coupling unit. Instead, the consuming device is operated directly with the load line. However, it is a disadvantage of this system that, in view of the many possible functions which can be or must be carried out, the distributor must be dimensioned much too large to include all these functions. Furthermore, a complete new distributor must be used when retrofitting which is also very cost intensive.

Moreover, the DE 40 19 465 A1 publication discloses a connecting device which consists of a basic module having a bus coupling unit and to which function-specific expansion modules, which are designed for specific user functions, are connected. The construction of this device is such that, starting out from the basic module, in each case a dedicated communication line is applied to each expansion module. By means of this line, the respective modules communicate with one another, the data being identified and redirected to the specific module by means of a microprocessor integrated in the basic module. However, the function of the individual modules themselves is disadvantageously specified by the pre-programming of the microprocessor and cannot be varied. Their use is therefore limited to these predetermined functions. Expansion modules merely represent implementing subunits, since they are merely implementing components which are addressed specifically by the sole microprocessor, the capacity of which is limited.

Furthermore, since the microprocessor, with its specified connection possibilities, is connected in each case with one expansion module, a maximum number of modules which can be connected is limited. It is furthermore a disadvantage that a separate communication line must be provided for each expansion module; this creates difficulties with respect to keeping the dimensions as small as possible. Moreover, because of the permanently installed communication lines, an expansion after permanent installation—if possible at all, in view of the small maximum number of modules specified by the possible connections of the processor—is not possible or possible only with difficulty, since either a new line will have to be laid directly to the processor or, if unused lines are passed through the module, these lines will first have to be extended or at least connected in the form described in the DE 40 19 465 A1, neither of which is done easily.

SUMMARY OF THE INVENTION

It is therefore an object of the invention to provide a connecting device, the structure of which is much simplified, so that improvements can be achieved with respect to the functionality as well as from the point of view of costs, manufacturing techniques and dimensioning.

This objective is accomplished pursuant to the invention by a connecting device having a base module including a base microcontroller, connected to an external data line by a bus coupling unit, from which an internal bus line is provided which passes through all the expansion modules and by means of which control information and/or status information is communicated to expansion module microcontrollers of each of the expansion modules.

The present invention provides a connecting device with only a single module bus line connecting all modules and over which all the data to and from the consuming units or the external bus line is transferred. With that, any number of expansion modules can be connected to the base module— depending, of course, on the capacity of the base microcontroller—without any difficulties whatsoever arising from a manufacturing point of view, since additional, separate communication lines do not have to be passed through the expansion module. In the case of the previously known connecting devices, expansion is limited since the expandability is limited to the maximum communication lines produced in the base module. In the present invention, the interaction between the base microcontroller, which handles the data taken from the data line on a basis of its application to a specific one of the expansion modules, and the expansion module microcontroller permits problem-free and accurately functioning communication between the individual modules.

In the simplest case, the internal bus line comprises a 2-wire line, each data line being suitable for a unidirectional, serial data transfer. Parallel to this, a supply line for the microcontrollers and the electronics of the expansion modules is passed through the latter and supplies a reference potential. Within the scope of the present invention an embodiment provides, for the purpose of a further simplification of structure, the internal bus line being a 1-wire line, in which the data advantageously is passed bidirectionally and serially.

Since the external bus line increasingly is run basically parallel to a power line on the side of the building, a further embodiment of the present invention provides the base module being coupled to the power line, which is run parallel to the external bus line, and the power line being passed through the base module and the expansion modules. By means of this embodiment it is thus achieved not only that the switching signals are supplied to the respective consuming units which, in the simplest case already have their own power supply, but also that the power supply to the consuming units is passed through the connecting device.

In order to realize as simple and reliable a connection as possible between the external bus line and the bus coupling unit as well as between the modules themselves, a further embodiment of the invention includes respective couplings and/or the internal module connections being constructed preferably as keyed plug-and-socket connections. The safety with respect to a permissible module coupling is increased particularly by the keying, which is optionally provided. Pursuant to the invention, for the purpose of decreasing individual components, coupling of the external data bus to the base unit and the coupling to the power line is realized in the form of a combination plug-and-socket connection, so that it is necessary to manufacture only a single plug-and-socket connection. It is equally advantageous if the bus line coupling and the power line coupling within the module is realized in the form of such a combination plug-and-socket connection.

Another embodiment of the present invention provides a structural improvement, particularly from a dimensional point of view, wherein the connecting device provides an adequate mechanical connection between the individual modules by means of the combination plug-and-socket connection. A still further embodiment provides means for the base module and the expansion modules being detachably locked together, so that inherently heavy modules can also be connected together securely, while permitting ease of unlocking the connection. This is realizable, for example, by manual locking or by locking means of a tool, such as screwdriver.

A further embodiment of the present invention provides for adapting the connecting device to already existing connecting devices and/or structural circumstances, particularly when retrofitting, by interconnection of the modules by an optional plug-in extension line. This is of advantage particularly in that an expansion module can be disposed at a site decentralized with respect to the already existing connecting device while providing reliable communication. In this case, the extension line, of course, contains the lines passed through from module to module namely, on the one hand, the internal bus line and, on the other, optionally the power supply.

In order to also make it possible to connect the individual consumer devices as simply and reliably as possible to the expansion module, a further feature of the present invention provides for connecting the consuming units, assigned to the expansion modules, by means of preferably keyed, plug-and-socket connections to the inputs and/or to the outputs. Of course, these plug-and-socket connections are optionally locked together. Pursuant to the invention, the inputs and/or outputs of the respective modules can also be offset towards the inside with respect to the module housing.

Since the bus coupling unit on the base module side also requires energy, even though the amount required is small, an appropriate power supply is provided. Pursuant to a feature of the invention, this can be realized owing to the fact that it is supplied with energy over the external bus line and is separated electrically from the subsequent module electronics preferably by means of optocouplers, so that signal malfunctions, brought about by the module electronics, are avoided in this manner and reliable data communication between the external bus line and the bus coupling unit is possible.

Furthermore, since the electronics of the base module as well as the electronics of the expansion module require a certain amount of energy, an auxiliary power supply is provided, which is disposed in the base module and optionally supplied over a power line which supplies the electronics of the base module as well as the electronics of the expansion module over an internal bus line. Alternatively, in another embodiment of the present invention, the auxiliary power supply may supply only the electronics of the base module, while the expansion module is supplied by being coupled within the expansion module to the power line passed through said module; in this case, of course, appropriate preparation has to be made, since preferably a 3-phase current is applied to the power line.

Furthermore, pursuant to a feature of the present invention, a controlling device, preferably a switch, for addressing the respective module, is accessible from the outside and disposed on the base module and/or the respective expansion modules in order to ensure unambiguous allocation of data. So that the respective module and, with that, the consuming device connected to it can be operated for servicing purposes even without being energized by the bus line in the building, a further embodiment of the present invention includes the controlling device configured so that the respective module can be stopped or operated continuously so that its functioning capability is manually overridden. In addition or alternatively, a further controlling device is optionally disposed at the base module and/or each expansion module, preferably in the form of a push-button switch, by means of which the respective module can be stopped or operated continuously.

In order to ensure that the base module prepares the data and allocates it to the individual modules correctly, provisions have been made, as already described, for the individual modules. In order to realize a further "safety feature" in this regard, provisions are furthermore made pursuant to the present invention and with particular advantage so that the microcontroller in the expansion modules is preset by a coding to its function-specific property required for the respective module and the therewith established type of the expansion module is transmitted over the internal bus line to the base module. Accordingly, there are available, as it were, two control mechanisms for a correct allocation, namely, on the one hand, the address itself and, on the other, the "module property signal". Both of these mechanisms are taken up and evaluated by the microcontroller of the base module for the purpose of checking the correctness of the data allocation. If an error is noted (that is, if the address and/or the module property signal do not agree with the data format), an error message is transmitted to the central control room and/or indicated directly at the respective module.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 2 shows three views (2a, 2b, 2c) of the base module of FIG. 1;

FIG. 3 shows two views (3a, 3b) of an expansion module of FIG. 1;

DETAILED DESCRIPTION OF THE PRESENT INVENTION

Figure 1:
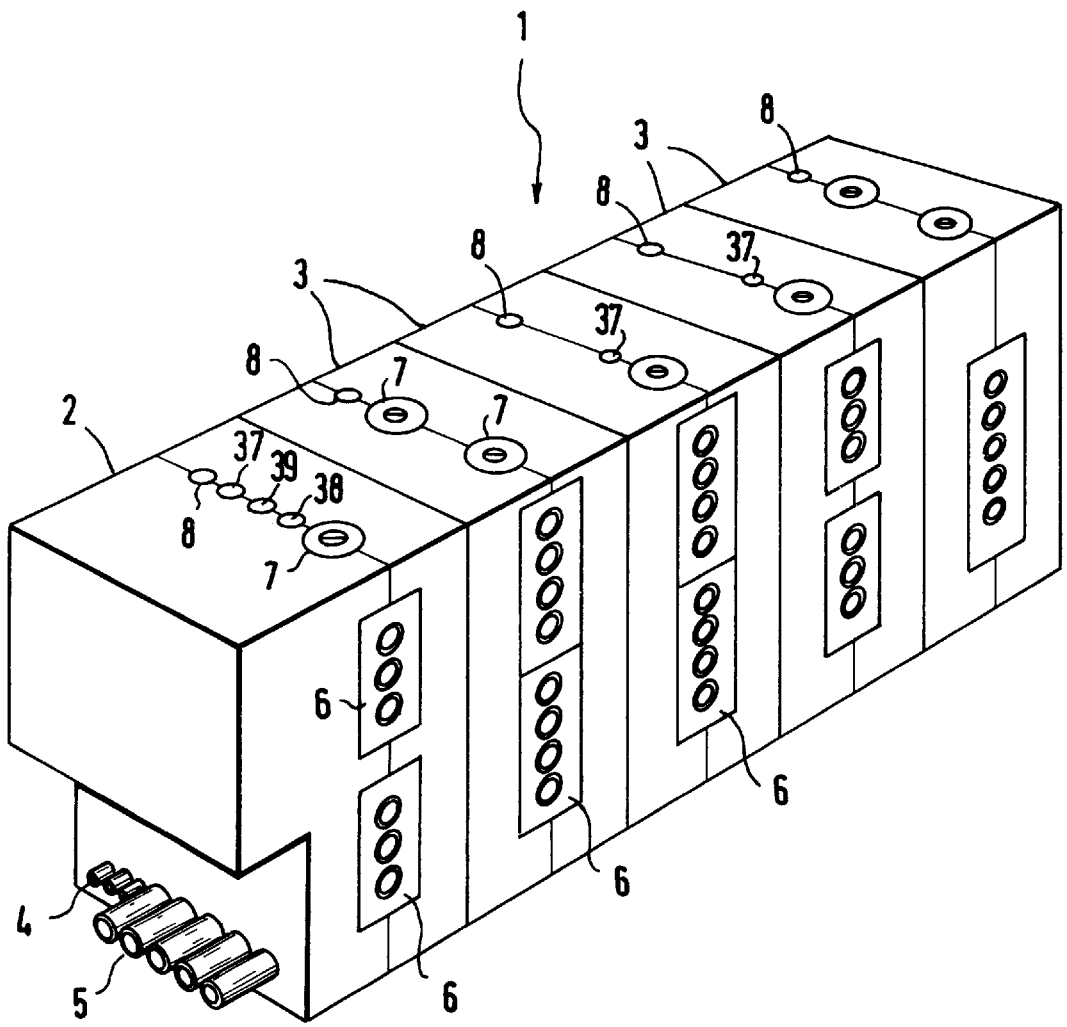
FIG. 1 shows a perspective view of a connecting device of the present invention including a base module and four expansion modules, in diagrammatic form.

Referring to FIG. 1, an embodiment of a plugged-together connecting device 1 of the present invention includes a base module 2 and various expansion modules 3. The base module 2 has a plug-in bus connector 4 for connection to an external bus line and a power connector 5 for coupling to power supply lines which run parallel to the external bus line. The base module 2 and the expansion modules 3 have various digital and/or analog inputs or outputs 6 for connection to consuming devices, the functions of which depend, of course, on the properties of the particular module. Controlling devices 7 are disposed on upper sides of the base module 2 and the expansion modules 3. The controlling devices 7 are optionally realizable as rotary switches which can be operated, for example, by means of a screwdriver or similar device, and by means of which functions of the base and expansion modules 2, 3 are addressed specifically. Signal devices 8 are provided on the individual ones of the base and expansion modules 2 and 3 for visually indicating a status of the respective module or any error messages. Module-specific adjusting devices in the form of push button switches 37 are provided for operating the respective modules for simulation purposes. In the examples shown, the push button switches 37 are provided on modules with at least one output. The base module 2 has an additional stylus 38 for physically programming the base module 2 with respect to an address for signals conducted over the external bus line. An indicator light 39 is disposed on the base module 2, which is on, for example, when the base module 2 has not yet been programmed, and off when the base module 2 is programmed and is associated with the stylus 38.

Referring to FIGS. 2a–2c, an embodiment of the base module 2 is shown in three views. In in FIG. 2a, a side of the base module 2 is shown, at which the coupling takes place to external bus line and the power supply. Aside from the plug-in bus connector 4 for the external bus line, the 5-pin power connector 5 is shown in detail. In particular, keying is realized by means of projections 9 which prevent an incorrect plug-in connection. FIG. 2b shows the base module turned through an angle of 90° with a plan view of the outputs 6. Here also, keying recesses 10 are provided at the outputs 6. Finally, FIG. 2c shows the other side of the base module 2. Data bus connector 11 for an internal data bus line, or module bus, of the base module 2 is provided and is also constructed as a plug-in connection for passing the internal data bus line through the expansion modules 3. A plug-in power connector 12 is provided for the power lines which are also passed through the individual expansion modules 3 and are also keyed in an appropriate manner.

Referring to FIGS. 3a and 3b, an embodiment of the expansion module 3 which is connectable directly to the base module 2 by a male data bus connector 13 for connection with the female data bus connector 11 of the base module 2. The internal data bus within the base module 2 is passed through the male data bus connector 13 into the expansion module 3. A male power connector 14 is provided for connection with the female power connector 12 of the base module 2. Line power is passed through the expansion modules 3 by means of the male power connector 14. Both male connectors 13 and 14 are, of course, keyed in accordance with the allocated female connectors 11, 12, as can be seen particularly in FIG. 3b. A function-specific connector 15 is also provided on the side of the expansion module 3. The function specific connector 15 has a total of four inputs with which data from the consuming systems can be received.

Aside from the construction of the respective function-specific connector, the construction of each of the expansion modules 3 is identical with respect to the construction of the female connectors 11 and 12 and the plug-in connectors 13 and 14, so that a sequence, in which the modules are plugged in, is immaterial and the expansion modules 3 are engageable with one another irrespective of their function. Should a particular sequence be preferred, a different keying of the plug-in connectors is realizable.

Figure 4:
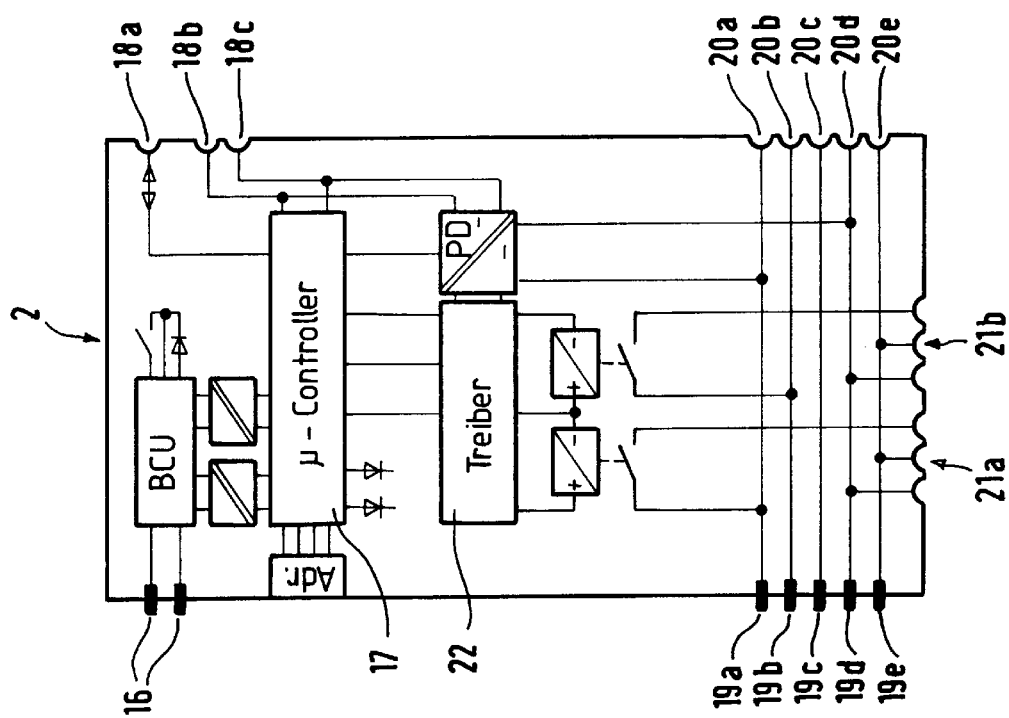
FIG. 4 shows a circuit diagram of the base module of FIG. 2.

Referring to FIG. 4, a circuit diagram of the base module 2 shows two-conductor line 16 of the external bus line, over which the data is supplied, is coupled to a bus coupling unit BCU interfaced with a microcontroller 17. The microcontroller 17 controls the data flow to and from the external bus line and processes the data accordingly. The internal data bus within the base module 2 includes three lines 18a, b and c. Line 18a serves for the transfer of data and lines 18b and 18c are the power supply lines for the microcontroller 17 and for electronics of the expansion modules 3. Lines 18a–18c pass through the data bus connector 11. The power supply lines supply a reference potential generated by a power supply PD. The entering line power is carried by lines 19a to 19e, the 3-phase current being fed in over the power lines 19a to 19c, line 19d representing the neutral conductor and line 19e the grounded conductor. All power lines 19a–19d are brought out once again at the opposite side of the base module 2 and end in the respective plug-in contacts 20a to 20e. Furthermore, the base module 2, shown in FIG. 4, is equipped with two outputs 21a, 21b, over which line power, taken off by lines 19a and 19b can be supplied to the consuming device (not shown) connected to the base module 2. For the purpose of controlling line power applied to the consuming device, a driver circuit 22 is provided, which is controlled by the microcontroller 17, and operates to control switches 122 which supply power to the consuming device.

Figure 5:
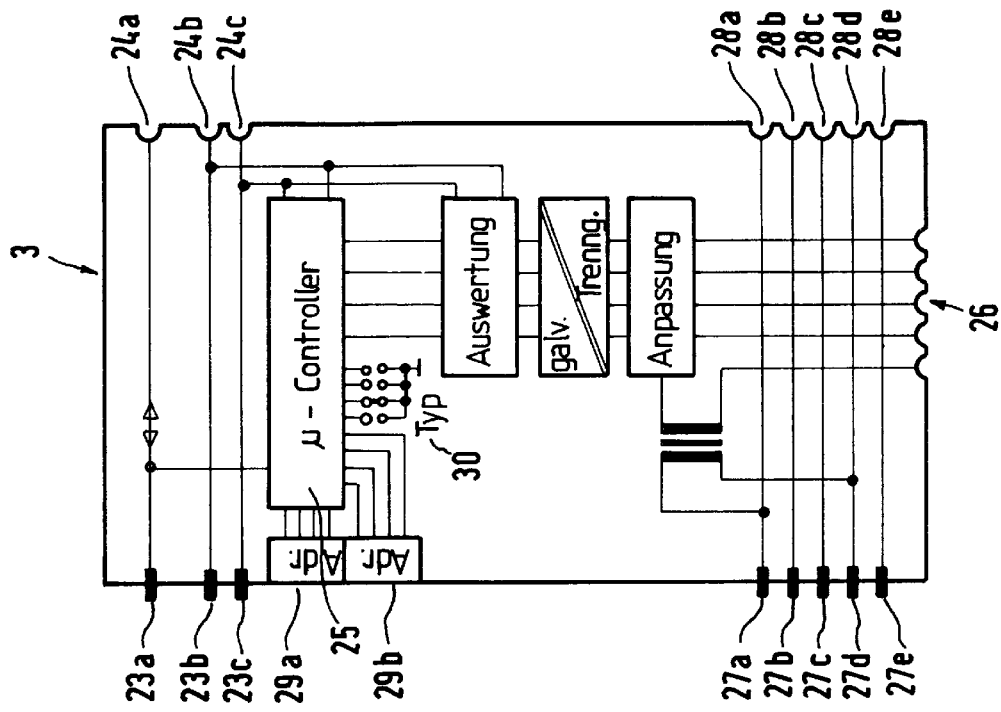
FIG. 5 shows a circuit diagram of the expansion module of FIG. 3.

Referring to FIG. 5, a circuit diagram of an embodiment of the expansion module 3, shown in FIG. 3, shows plug-in contacts 23a, 23b and 23c, corresponding to the data bus connector 13, which, when connected to the base module 2, are connected into the female connectors 18a to c, of the data bus connector 11, which realize the internal data bus, or module bus, and thus continue the module bus. The three individual lines are passed through the expansion module 3 and emerge again at the other side at the female connectors 24a, 24b, 24c, corresponding to the data bus connector 11 of the expansion module 3. A microcontroller 25 is connected with the data line of the plug-in contact 23a. The data, carried over the line and allocated to the specific expansion module 3, is selected by the microcontroller or, as in this case, supplied to the data line, since the module of FIG. 5 is an input module with which the signals, coming from the consuming devices, are supplied to the external bus line. The connections 26, to which the consuming devices are coupled, are used for this purpose. Here also, there are five male connectors 27a to 27e in the lower module, corresponding to the power connectors 12 and 14, which find their complementary connection in the female connectors 20a to 20e of the base module. They also emerge once again at the opposite side of the female connectors 28a to 28e. Furthermore, two switches 29a, 29b are provided for setting the address of the specific expansion module 3 or, in this case, of the respective input pair 26, since the module described has two separate input pairs, which can also be addressed separately. Furthermore, a device 30 is shown, by means of which the specific function of the microcontroller itself is programmed or identified. The coding signal, which can be produced by these means, is supplied to the data line, in order to realize by these means, within the scope of a feedback to the microcontroller 17 of the base module 2, a further safety check with respect to data preparation and allocation.

Figure 6:
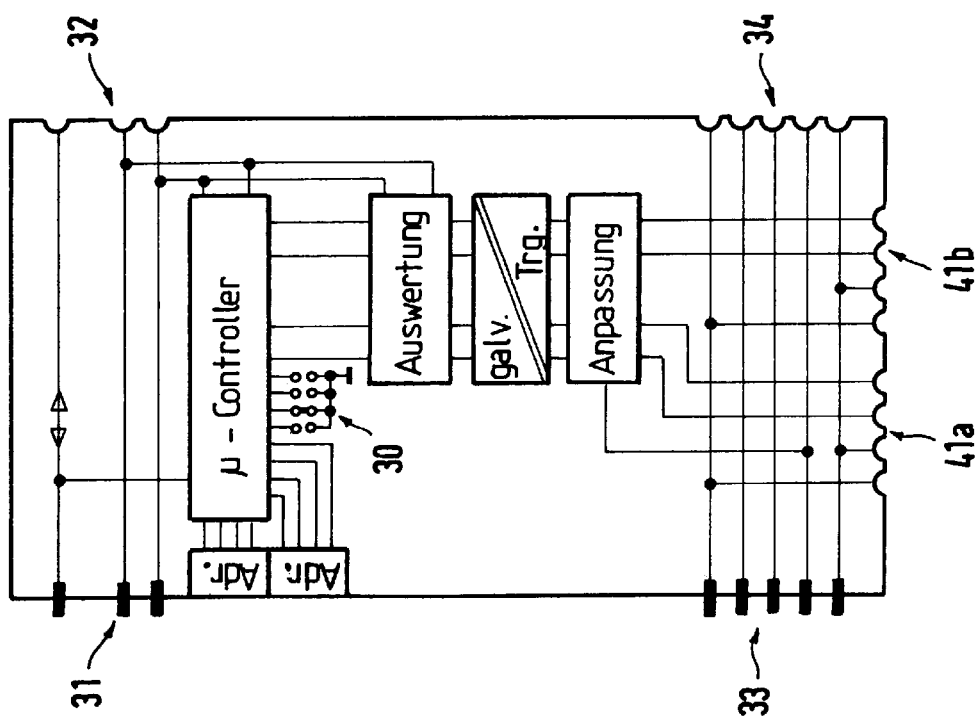
FIG. 6 shows a circuit diagram of another embodiment of the expansion module of FIG. 3.

Referring to FIG. 6, a further embodiment of the expansion module 2 has appropriate male connectors 31 and female connectors 32 by means of which the internal data bus, or module bus, within connecting device is continued. The same applies for the corresponding male and female connectors 33, 34 with respect to the power supply lines for line power. The further construction of the module with respect to the addressing switch and the microcontroller corresponds largely to that of FIG. 5, since this module is also an input module with two separate input pairs 41a, 41b. However, a voltage of 230 volts is used, whereas the module shown in FIG. 5 works with a voltage of 24 volts.

Figure 7:
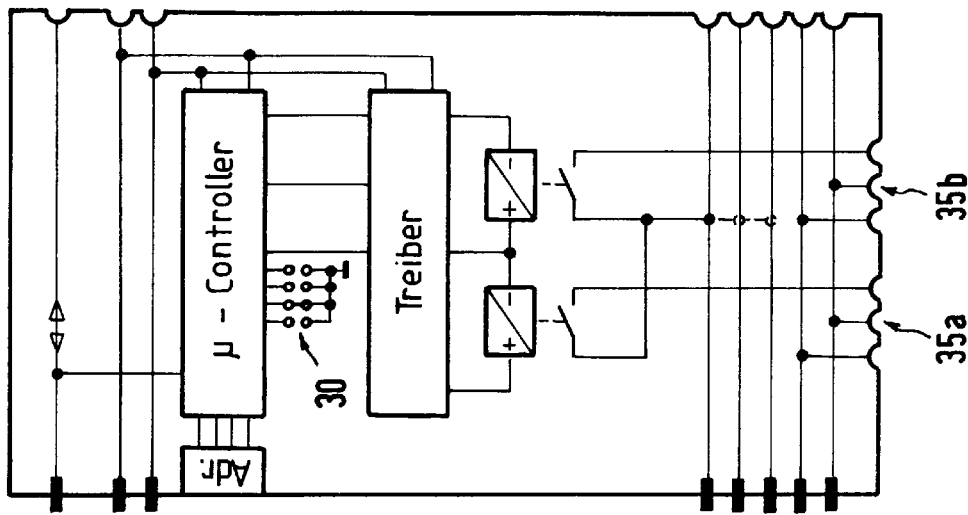
FIG. 7 shows a circuit diagram of another embodiment of the expansion module of FIG. 3.

A further embodiment of an expansion module is shown in FIG. 7. Aside from the otherwise typical construction, this module has two outputs 35a, 35b, with which a voltage of 230 volts, as supplied by the power supply as 3-phase current, is made available. Fluorescent lamps or halogen lamps, for example, can be switched by this module.

Figure 8:
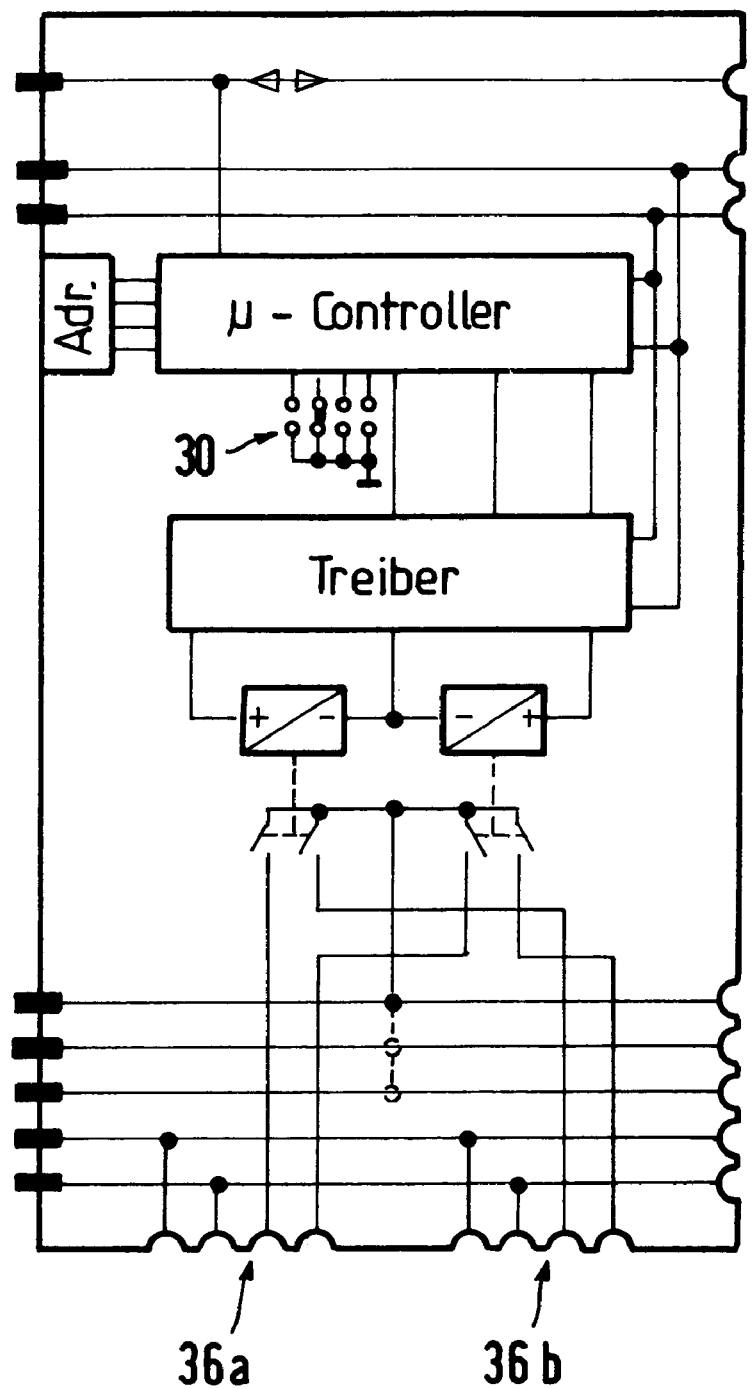
FIG. 8 shows a circuit diagram of another embodiment of the expansion module of FIG. 3.

A further realization of a module is shown in FIG. 8. This module makes available two outputs 36a, 36b with a voltage of 230 volts. In the case shown, they are synchronous. An awnings motor, for example, can be switched with this module.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A connection system for an electrical installation system for one of controlling consuming devices and redirecting status signals, wherein control signals are supplied by an external bus line using serial digital data transfer, the connection system comprising:

a base module having an internal data bus;

the base module including a bus coupling unit for coupling with said external bus line;

the base module including a base controller interfaced with said bus coupling unit and responsive to said control signals for coupling signals from said external data bus to said internal data bus;

expansion modules each having an internal data bus;

expansion unit controllers disposed such that said expansion modules each include an expansion unit controller of said expansion unit controllers;

said expansion modules having at least one of digital and analog ports, controlled by said expansion unit controllers, for interconnection with respective ones of said consuming devices;

said expansion modules and said base module including plug-in connectors serially interconnecting with each other to connect together said internal data busses of said base module and said expansion modules to form a common internal data bus;

said plug-in connectors being disposed on a side of said base module and on sides of said expansion modules so as to mechanically rigidly interconnect said base module with any of said expansion modules and mechanically rigidly interconnect said expansion modules with one another;

said common internal data bus permitting communication between said base controller and any one of said expansion unit controllers; and said expansion unit controllers including means responsive to data sent by said base controller over said common internal data bus for controlling said one of analog and digital interface with said consuming devices and exchanging data over said common internal data bus.

2. The connection system of claim 1 wherein the common internal data bus is a one-wire line.

3. The connection system of claim 1, wherein the base module includes a line power connector for connection to line power and said expansion modules and said base module include line power connectors for coupling said line power from said base module to and through each of said expansion modules.

4. The connection system of claim 3 further comprising said base module including a power supply, supplied with line power through said line power connector, for driving said base controller and said expansion modules and said base module include means for interconnecting said power supply with said expansion modules to drive said expansion unit controllers of said expansion modules.

5. The connection system of claim 3, further comprising:

said base module including a power supply, supplied with said line power through said line power connector, for driving said base controller of said base module; and said expansion modules each including a power supply, supplied with said line power, for driving said expansion unit controllers and other electronics of said expansion modules.

6. The connection system of claim 1 wherein the plug-in connectors are keyed plug-in connectors.

7. The connection system of one of the claims 1 wherein external power lines are connected to said base module by a power line plug-in connector and the bus coupling unit includes an plug-in connector for connection to said external bus line.

8. The connection system of one of the claims 7, wherein the plug-in connector for the external bus line and the power line plug-in connector are constructed as a single connector.

9. The connection system of claim 1 further including means for detachably locking together said base module and said expansion modules.

10. The connection system of claim 1 further including a plug-in extension cord for interfacing with said plug-in connectors for one of:

connecting one of said expansion modules with another one of said expansion modules; and connecting said base module with one of said expansion modules.

11. The connection system of claim 1 wherein the consuming devices are connected to said at least one of digital and analog ports by means of a device plug-in connector.

12. The connection system of claim 11, wherein the device plug-in connector is a keyed plug-in connector.

13. The connection system of claim 1 further including isolating means for electrically isolating said bus coupling unit from said base controller and other electronics of said base module.

14. The connection system of claim 13, wherein said isolating means include an optocoupler.

15. The connection system of claim 1 further comprising said base module including a power supply for driving said base controller and said expansion modules and said base module include means for interconnecting said power supply with said expansion modules to drive said expansion unit controllers of said expansion modules.

16. The connection system of claim 1 wherein said base module and said expansion modules have a common configuration such that said first and second base module sides and said first and second expansion module sides have a common outline.

17. The connection system of claim 1, further comprising:
   said base module including a power supply for driving said base controller and other electronics of said base module; and
   said expansion modules each including a power supply for driving said expansion unit controllers and other electronics of said expansion modules.

18. The connection system of claim 1 wherein said one of digital and analog ports are offset towards the inside with respect to the module housing.

19. The connection system of claim 1 further comprising an externally accessible controlling device disposed on one of said base module and said expansion modules for interfacing with a respective one of said base controller and said expansion unit controllers to effect addressing.

20. The connection system of claim 19, wherein the controlling device is constructed as a switch.

21. The connection system of claim 19 wherein a respective one of said base module and said expansion modules is one of stopped and operated continuously by means of the controlling device.

22. The connection system of claim 1 further comprising said expansion modules including a means for pre-setting each of said expansion unit controllers using a coding corresponding to a specific functional property required for the respective one of said expansion modules and means for setting an address of each of said expansion modules to permit specific communication between said base controller and said expansion unit controller of said respective one of said expansion modules.

23. A connection system for an electrical installation system for one of controlling consuming devices and redirecting status signals, wherein control signals are supplied by an external bus line using serial digital data transfer, the connection system comprising:
   a base module having a base module housing with first and second base module sides opposite one another and an internal data bus;
   said base module housing including an external bus connector fixedly mounted in said base module housing and a bus coupling unit within said base module housing for coupling with said external bus line via said external bus connector to couple said control signals from said external data bus;
   said base module including a base controller within said base module housing, interfaced with said bus coupling unit and responsive to said control signals;
   expansion modules each having an expansion module housing having first and second expansion module sides opposite one another and an internal data bus;
   expansion unit controllers disposed such that each of said expansion modules has an expansion unit controller of said expansion unit controllers in said expansion module housing interfaced with said internal data bus;
   said expansion modules having at least one of digital and analog ports, controlled by said expansion unit controllers, disposed on said expansion module housing on a side other than said first and second expansion module sides for interconnection with respective ones of said consuming devices;
   said expansion modules and said base module including plug-in connectors disposed in said second base module side and said first and second expansion module sides for serially rigidly interconnecting said base module housing with said first expansion module side of one of said expansion modules and for serially rigidly interconnecting said second expansion module sides with said first expansion module sides;
   said plug-in connectors interconnecting said internal data busses of said expansion modules and said base modules to form a common internal data bus thereby interconnecting said base controller and said expansion unit controllers by a common data path, said common internal data bus permitting communication between said base controller and any one of said expansion module controllers;
   said expansion unit controllers including means selectively responsive to data sent by said base controller over said common internal data bus for controlling said one of analog and digital interface with said consuming devices and exchanging data over said common internal data bus;
   individual ones of said expansion modules being differently structured for specific functions distinct from other ones of said expansion modules; and
   said expansion modules including a means for pre-setting each of said expansion module controllers using a coding corresponding to one of said specific functions of the respective one of said expansion modules and means for setting an address of each of said expansion modules to permit specific communication between said base controller and said expansion module controller of said respective one of said expansion modules.

24. The connection system of claim 23 wherein said base module and said expansion modules have a common configuration such that said first and second base module sides and said first and second expansion module sides have a common outline.

25. The connection system of claim 23 further comprising said base module including a power supply for driving said base controller and said plug-in connectors including means for interconnecting said power supply with said expansion modules to drive said expansion module controllers.

26. The connection system of claim 23 wherein the common internal data bus is a one-wire line.

27. The connection system of claim 23, wherein the base module includes a line power connector for connection to line power and said plug-in connectors includes line power connectors for coupling said line power from said base module to and through each of said expansion modules.

28. The connection system of claim 27, further comprising:

said base module including a power supply driven by said line power for driving said base controller; and said expansion modules each including a power supply driven by said line power for driving said expansion module controllers.

29. The connection system of claim 23 further including means for detachably locking together said base module and said expansion modules.

30. The connection system of claim 23 further including a plug-in extension cord for interfacing with said plug-in connectors for one of:

connecting one of said expansion modules with another one of said expansion modules; and connecting said base module with one of said expansion modules.

31. The connection system of claim 23 further including isolating means for electrically isolating said bus coupling unit from said base controller of said base module.

* * * * *